(12) United States Patent
Renken et al.

(10) Patent No.: US 7,757,574 B2
(45) Date of Patent: Jul. 20, 2010

(54) PROCESS CONDITION SENSING WAFER AND DATA ANALYSIS SYSTEM

(75) Inventors: Wayne G. Renken, San Jose, CA (US); Mei H. Sun, Los Altos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 514 days.

(21) Appl. No.: 11/302,763

(22) Filed: Dec. 13, 2005

(65) Prior Publication Data

US 2006/0174720 A1 Aug. 10, 2006

Related U.S. Application Data

(60) Continuation-in-part of application No. 10/685,550, filed on Oct. 14, 2003, now Pat. No. 7,360,463, which is a division of application No. 10/056,906, filed on Jan. 24, 2002, now Pat. No. 6,889,568.

(51) Int. Cl.
G01D 7/02 (2006.01)

(52) U.S. Cl. ............... 73/866.1; 73/866; 73/865.9; 438/17

(58) Field of Classification Search ............... 73/866.1, 73/865.9, 866
See application file for complete search history.

(56) References Cited

U.S. PATENT DOCUMENTS

| | | | | |
|---|---|---|---|---|
| 3,589,979 A | * | 6/1971 | Finch et al. ............... 162/219 |
| RE32,369 E | | 3/1987 | Stockton et al. |
| 4,656,454 A | * | 4/1987 | Rosenberger ............... 338/2 |
| 4,680,569 A | * | 7/1987 | Yamaki et al. ............... 338/42 |
| 5,001,934 A | * | 3/1991 | Tuckey ............... 73/721 |
| 5,184,107 A | * | 2/1993 | Maurer ............... 338/42 |
| 5,262,944 A | | 11/1993 | Weisner et al. |
| 5,341,684 A | * | 8/1994 | Adams et al. ............... 73/756 |
| 5,435,646 A | | 7/1995 | McArthur |
| 5,444,637 A | | 8/1995 | Smesny et al. |
| 5,479,197 A | | 12/1995 | Fujikawa et al. ............... 347/63 |

(Continued)

FOREIGN PATENT DOCUMENTS

EP 0539804 5/1993

(Continued)

OTHER PUBLICATIONS

Office Action dated Jun. 18, 2003 for U.S. Appl. No. 10/056,906.

(Continued)

*Primary Examiner*—Hezron Williams
*Assistant Examiner*—Samir M Shah
(74) *Attorney, Agent, or Firm*—Joshua D. Isenberg; JDI Patent

(57) ABSTRACT

A measuring device incorporating a substrate with sensors that measure the processing conditions that a wafer may undergo during manufacturing. The substrate can be inserted into a processing chamber by a robot head and the measuring device can transmit the conditions in real time or store the conditions for subsequent analysis. Sensitive electronic components of the device can be distanced or isolated from the most deleterious processing conditions in order increase the accuracy, operating range, and reliability of the device. Isolation may be provided by vacuum or suitable material and phase change material may be located adjacent to electronics to maintain a low temperature.

11 Claims, 12 Drawing Sheets

U.S. PATENT DOCUMENTS

| | | | |
|---|---|---|---|
| 5,564,889 A | | 10/1996 | Araki |
| 5,629,538 A * | | 5/1997 | Lipphardt et al. ............ 257/254 |
| 5,669,713 A | | 9/1997 | Schwartz et al. |
| 5,790,151 A | | 8/1998 | Mills ........................... 347/47 |
| 5,895,859 A * | | 4/1999 | Sawada et al. ................. 73/706 |
| 5,969,639 A | | 10/1999 | Lauf et al. |
| 5,970,313 A | | 10/1999 | Rowland et al. |
| 6,010,538 A | | 1/2000 | Sun et al. |
| 6,033,922 A | | 3/2000 | Rowland et al. |
| 6,075,909 A | | 6/2000 | Ressl |
| 6,100,506 A | | 8/2000 | Colelli, Jr. et al. |
| 6,164,132 A * | | 12/2000 | Matulek ................... 73/304 C |
| 6,190,040 B1 | | 2/2001 | Renken et al. |
| 6,201,467 B1 * | | 3/2001 | Winterer et al. ............... 338/42 |
| 6,273,544 B1 | | 8/2001 | Silverbrook ................. 347/20 |
| 6,313,903 B1 | | 11/2001 | Ogata |
| 6,325,536 B1 | | 12/2001 | Renken et al. |
| 6,378,378 B1 | | 4/2002 | Fisher |
| 6,472,240 B2 | | 10/2002 | Akram et al. |
| 6,477,447 B1 * | | 11/2002 | Lin ............................. 700/301 |
| 6,542,835 B2 | | 4/2003 | Mundt |
| 6,553,277 B1 | | 4/2003 | Yagisawa et al. |
| 6,590,777 B2 * | | 7/2003 | Morino et al. .............. 361/736 |
| 6,651,488 B2 | | 11/2003 | Larson, III et al. |
| 6,655,835 B2 | | 12/2003 | Mattoon et al. |
| 6,671,660 B2 | | 12/2003 | Freed |
| 6,677,166 B2 | | 1/2004 | Hunter |
| 6,734,027 B2 | | 5/2004 | Jonkers |
| 6,738,722 B2 | | 5/2004 | Poolla et al. |
| 6,741,945 B2 | | 5/2004 | Poolla et al. |
| 6,759,253 B2 | | 7/2004 | Usui et al. |
| 6,789,034 B2 | | 9/2004 | Freed |
| 6,889,568 B2 | | 5/2005 | Renken |
| 6,895,831 B2 | | 5/2005 | Hunter |
| 6,915,589 B2 | | 7/2005 | Sun et al. |
| 6,966,235 B1 * | | 11/2005 | Paton ........................ 73/865.9 |
| 6,971,036 B2 | | 11/2005 | Freed |
| 6,995,691 B2 | | 2/2006 | Parsons |
| 7,005,644 B2 * | | 2/2006 | Ishikawa et al. ....... 250/339.04 |
| 7,135,852 B2 | | 11/2006 | Renken et al. |
| 7,151,366 B2 | | 12/2006 | Renken et al. |
| 7,331,250 B2 | | 2/2008 | Hunter |
| 7,360,463 B2 | | 4/2008 | Renken ..................... 73/866.1 |
| 7,385,199 B2 * | | 6/2008 | DeWames et al. ........... 250/340 |
| 7,434,485 B2 | | 10/2008 | Hunter |
| 2001/0002119 A1 * | | 5/2001 | Winterer et al. ............... 338/42 |
| 2001/0012639 A1 | | 8/2001 | Akram et al. |
| 2004/0074323 A1 | | 4/2004 | Renken ..................... 73/866.1 |
| 2004/0031340 A1 | | 12/2004 | Renken |
| 2008/0228419 A1 | | 9/2008 | Renken et al. |

FOREIGN PATENT DOCUMENTS

| | | |
|---|---|---|
| EP | 0 563 713 | 10/1993 |
| EP | 0764977 | 3/1997 |
| EP | 0865922 | 9/1998 |
| EP | 1014437 A2 | 6/2000 |
| GB | 2086807 | 5/1982 |
| WO | WO00/68986 | 11/2000 |
| WO | WO02/17030 A2 | 2/2002 |
| WO | WO02/17030 A3 | 2/2002 |
| WO | WO 03/067183 | 8/2003 |

OTHER PUBLICATIONS

Final Office Action Dated Jan. 12, 2004 for U.S. Appl. No. 10/056,906.

Office Action dated Jun. 29, 2004 for U.S. Appl. No. 10/685,550.

Final Office Action dated Mar. 16, 2006 for U.S. Appl. No. 10/685,550.

Office Action dated Sep. 25, 2006 for U.S. Appl. No. 10/685,550.

Final Office Action dated Mar. 29, 2007 for U.S. Appl. No. 10/685,550.

Notice of Allowance dated Dec. 17, 2007 for U.S. Appl. No. 10/685,550.

Notice of Allowance dated Sep. 7, 2004 for U.S. Appl. No. 10/056,906.

Office Action dated Aug. 22, 2007 of U.S. Appl. No. 10/685,550 published as Publication No. 2004/0074323.

Baker et al.; "A Novel In Situ Monitoring Technique for Reactive Ion Etching Using a Surface Micromachined Sensor," IEEE Transactions on Semiconductor Manufacturing, vol. 11, No. 2, May 1998, pp. 254-264.

U.S. Appl. No. 60/285,613, filed Apr. 19, 2001; Freed et al.; "Firmware, Methods, Apparatus, and Computer Program Products for Wafer Sensors".

U.S. Appl. No. 60/285,439, filed Apr. 19, 2001; Freed et al.; "Methods Apparatus, and Computer Program Products for Obtaining Data for Process Operation, Optimization, Monitoring, and Control".

Freed et al.; "Autonomous On-Wafer Sensors for Process Modeling, Diagnosis, and Control," IEEE Transactions on Semiconductor Manufacturing, vol. 14, No. 3, Aug. 2001, pp. 255-264.

Freed; "Wafer-Mounted Sensor Arrays for Plasma Etch Processes", Dissertation, Univ. of CA. Berkeley, Fall 2001.

International Search Report, corresponding to PCT/US03/00751, Aug. 1, 2003, 3 pages.

"Notification of Transmittal of the International Search Report or the Declaration", corresponding PCT application No. PCT/US03/00751, International Searching Authority, European Patent Office, Jun. 8, 2003, 7 pages.

PTO, "Office Action," corresponding U.S. Appl. No. 10/685,550, Sep. 25, 2006, 18 pages.

Rubitherm GmbH, "Rubitherm® RT, Phase Change Material based on n-Paraffins and Waxes," Innovative PCM's and Thermal Technology, Rubitherm Phase Change Material, Version: Jun. 15, 2004, 2 pages.

Unsolicited e-mail from Steve Maxwell at steve_maxwell60@yahoo.com to info@phdr-law.com, dated Jan. 3, 2006, 1 page.

Office Action dated Jan. 25, 2010 issued for Korean Patent Application No. 2004-7011508.

Office Action dated Oct. 20, 2009 issued for Japanese Patent Application No. 2003-563004.

U.S. Appl. No. 12/690,882 filed on Jan. 20, 2010.

Ex Parte Quayle Office Action dated Apr. 2, 2010 issued for U.S. Appl. No. 12/106,998.

U.S. Appl. No. 12/787,326 filed May 25, 2010.

* cited by examiner

PROCESS CONDITION SENSING WAFER AND DATA ANALYSIS SYSTEM

CROSS-REFERENCE TO RELATED APPLICATIONS

This application is a continuation-in-part of application Ser. No. 10/685,550, filed Oct. 14, 2003; which application is a divisional of application Ser. No. 10/056,906, filed Jan. 24, 2002, now U.S. Pat. No. 6,889,568. These applications are incorporated by reference as if fully set forth herein.

BACKGROUND OF THE INVENTION

1. Field of the Invention

The present invention relates to a semiconductor wafer processing, LCD display glass substrate processing, magnetic memory disc processing and other devices fabricated from thin film processes and more specifically to a substrate which can sense and transmit processing conditions.

2. Discussion of the Related Art

The fabrication of an integrated circuit, display or disc memory generally employs numerous processing steps. Each process step must be carefully monitored in order to provide an operational device. Throughout the imaging process, deposition and growth process, etching and masking process, etc., it is critical, for example, that temperature, gas flow, vacuum pressure, chemical gas or plasma composition and exposure distance be carefully controlled during each step. Careful attention to the various processing conditions involved in each step is a requirement of optimal semiconductor or thin film processes. Any deviation from optimal processing conditions may cause the ensuing integrated circuit or device to perform at a substandard level or, worse yet, fail completely.

Within a processing chamber, processing conditions vary. The variations in processing conditions such as temperature, gas flow rate and/or gas composition greatly affect the formation and thus the performance of the integrated circuit. Using a substrate to measure the processing conditions that is of the same or similar material as the integrated circuit or other device provides the most accurate measure of the conditions because the thermal conductivity of the substrate is the same as the actual circuits that will be processed. Gradients and variations exist throughout the chamber for virtually all process conditions. These gradients therefore also exist across the surface of a substrate. In order to precisely control processing conditions at the wafer, it is critical that measurements be taken upon the wafer and the readings be available in real time to an automated control system or operator so that the optimization of the chamber processing conditions can be readily achieved. Processing conditions include any parameter used to control semiconductor or other device manufacture or any condition a manufacturer would desire to monitor.

Within the processing chamber a robot head transports the test wafer or substrate. One example of a device incorporating a robot head is manufactured by the TEL Corporation. The robot head can pivot. The robot head also incorporates multiple levels or hands. A first level or hand can extend out and a second level or hand can further extend out carrying a wafer. A second robot or moving platform can receive the wafer and extend it to a third holder which lowers it into the process chamber. For more information about the robot head and processing chamber, please refer to U.S. Pat. No. 5,564,889 to Araki, entitled "Semiconductor Treatment System and Method for Exchanging and Treating Substrate," which is hereby incorporated by this reference in its entirety.

SUMMARY OF THE INVENTION

Placement of sensors directly upon or in the substrate and spaced throughout the substrate surface yields an accurate gradient reading of various processing conditions upon the surface of the wafer. The processing conditions may be stored in memory for later evaluation or are available in real time to be read via a remote data processing device such as a computer, PDA or any other microprocessor controlled device that can present information and receive input from a control system or operator. The operator can monitor the processing conditions in real time, and then alter the settings of the processing chamber to reach an ideal state while continuing to monitor the effects, or this may be accomplished by an automated optimization and control system. Additionally, subsequent processing steps can be instantaneously modified based on a process condition of a prior step.

Distancing sensitive electronic circuitry from the processing conditions results in a wider operating range and more accurate, reliable, repeatable and drift-free operation.

Electronics platforms have legs that distance sensitive components from the substrate so that these components are not exposed to the same process conditions as the substrate. In particular, internal electronic components may be at a lower temperature than the substrate. Particular features may be added to an electronics platform to protect sensitive internal components including integrated circuits and power sources such as batteries. A thermally insulating volume may be incorporated into an electronics platform to provide insulation between an outer enclosure and internal components. Where the electronics module is used under vacuum, this insulating volume may have an opening to the exterior so that it is under vacuum during operation and thus provides good thermal insulation. In other examples, an insulating volume may be filled with appropriate material. An outer enclosure may have reflective surfaces so that radiant heat reaching the enclosure tends to be reflected. The outer enclosure may also be made of a material with a high specific heat capacity so that its temperature rises slowly. A portion of phase change material may be included in an electronics module to keep internal components at reduced temperature. Typically, the phase change material has a melting point between room temperature and the highest operating temperature of the internal components. An electronics platform may be mounted to a substrate at various locations on a surface, or may be mounted so that it extends partially or completely beyond a surface.

DETAILED DESCRIPTION OF THE INVENTION

The measurement system of the present invention measures processing conditions in various locations of a wafer or substrate and transmits them in real time to a data processing device or records them in memory for later transmission or downloading of process conditions.

As defined herein, "processing conditions" refer to various processing parameters used in manufacturing an integrated circuit. Processing conditions include any parameter used to control semiconductor manufacture or any condition a manufacturer would desire to monitor such as but not limited to temperature, processing chamber pressure, gas flow rate within the chamber, gaseous chemical composition within the chamber, ion current density, ion current energy, light energy density, and vibration and acceleration of the wafer.

The invention will now be described with reference to the figures.

Figure 1A:
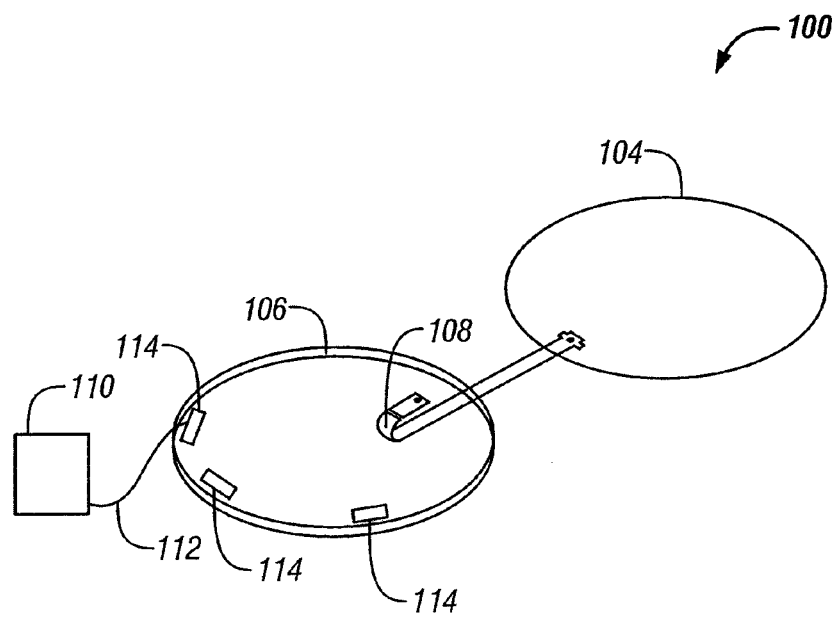
FIG. 1A is a perspective view of PCMD 100, a first embodiment of the invention, in an extended state.

FIG. 1A illustrates processing condition measuring device ("PCMD") 100, a first embodiment of the invention, in an extended position. PCMD 100 has two principal pieces, substrate 104 and electronics disc 106. The substrate 104 is used to measure the processing conditions of semiconductor manufacturing equipment, glass substrate processing equipment, and magnetic memory disc processing equipment. Specifically, it is used to measure the conditions that a wafer or substrate undergoes during processing. Sensors are arranged in different areas on the surface or within substrate 104 in order to measure the processing conditions across the substrate. By measuring in different areas of the substrate, the gradient across the substrate can be calculated, and additionally, the condition at a particular location of the substrate can be correlated to the resultant characteristics of the substrate. The number of sensors in/on substrate 104 will vary upon the processing condition being measured and the size of substrate 104. In one embodiment for measuring temperature, a 200 mm diameter substrate has 17 sensors whereas a 300 mm diameter substrate has 29 sensors. Substrate 104 will be discussed later in more detail with regard to FIGS. 1G-1H.

Electronics disc 106 is connected to substrate 104 by cable 108. Cable 108 can be any type of cable but is preferably a flat ribbon type cable that is flexible and has a low profile. The processing conditions that PCMD will be subjected to often involve high or variable temperatures or other conditions, both of which negatively affect the functionality, accuracy, and reliability of electronic components. Furthermore, numerous other processing steps and conditions make it advantageous to distance the electronics from the process or even to locate the electronics outside of the processing environment. Separating the PCMD into two pieces, in this embodiment, allows the substrate and the sensors to be inside of the processing chamber while the electronics can remain outside of the chamber free from the deleterious effects of the elevated temperature and the other various processing conditions. Cable 108 of PCMD 100 thus may pass from the exterior to the interior of the processing chamber under a chamber seal to allow the process to proceed without risk of leakage of the process atmosphere to or from the exterior environment. The cable is preferably made of a material resistant to temperature and other gaseous chemicals used in the manufacturing process such as polyimide.

Data processing device ("DPD") 110 is connected to electronics disc 106 with telecommunications link 112 at data port 114. Telecommunications link 112 may be a wired or wireless link and will be described later in further detail with regard to FIG. 1F.

Figure 1B:
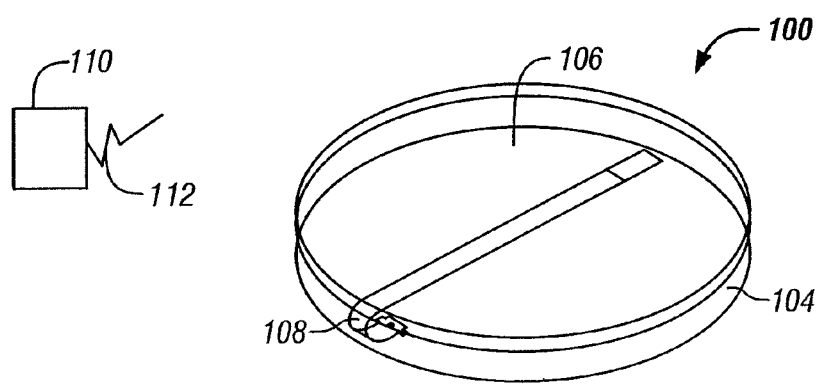
FIG. 1B is a perspective view of PCMD 100 in a concentric state.

FIG. 1B shows substrate 104 and electronics disc 106 concentrically located with cable 108 between them. Concentric is hereby defined as the circumference of one circle being within the circumference of another circle, the circles not necessarily having the same center. Thus, this definition also encompasses eccentricity of the circles.

Figure 1C:
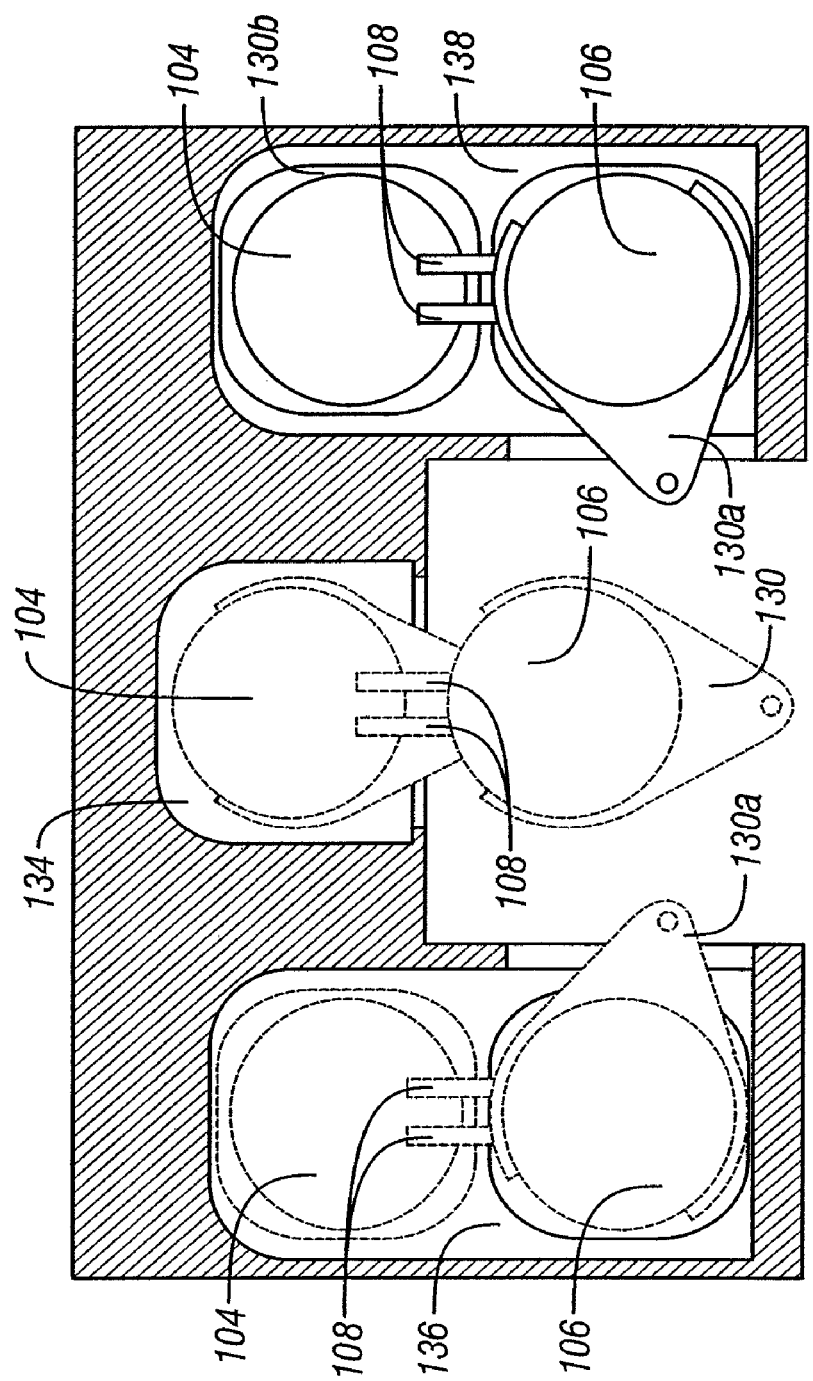
FIG. 1C is a top view of a processing chamber and robot hand.
Figure 1D:
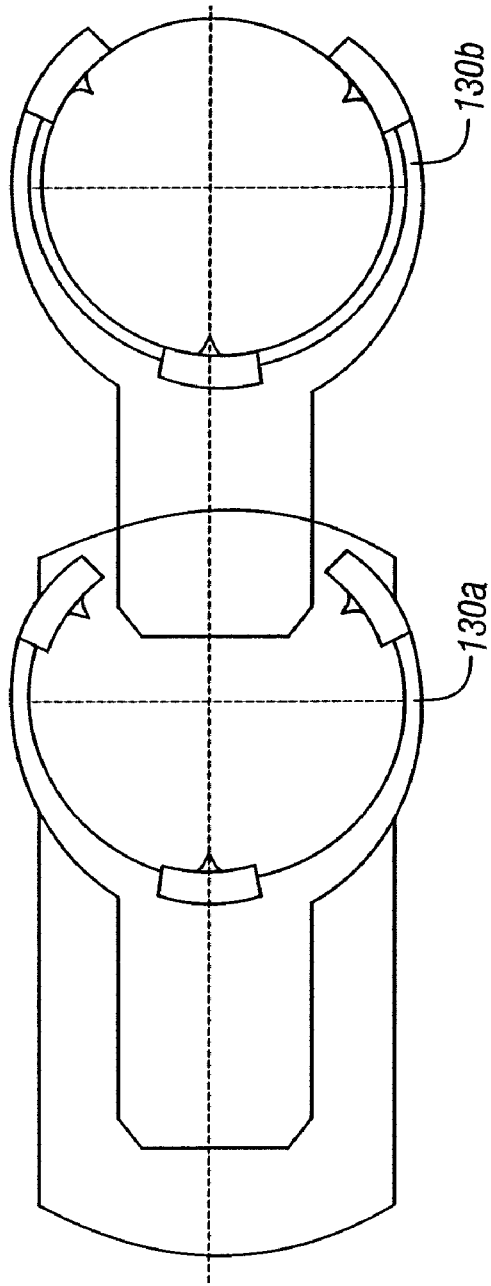
FIG. 1D is a top view of a robot hand extending.
Figure 1E:
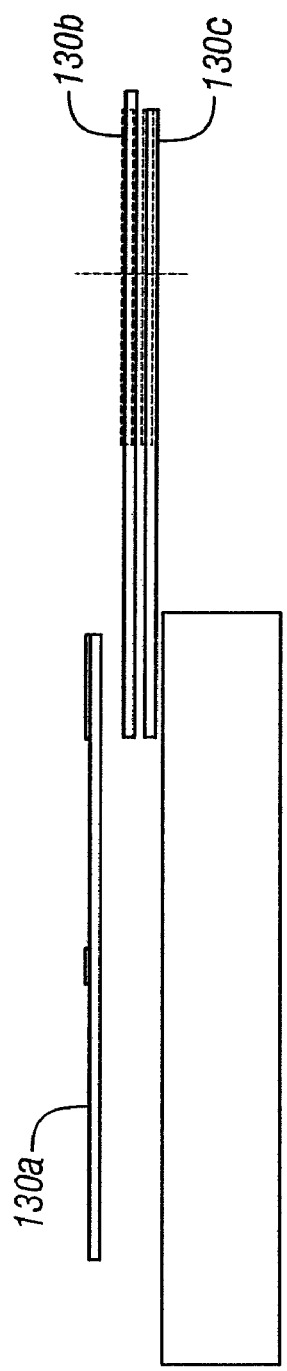
FIG. 1E is a plan view of a robot hand extending.

Concentrically located, they can be loaded into two robot arms spaced one above the other. The substrate 104 with the sensors would be held by the lower robot arm. The lower arm may be extended for insertion of the substrate 104 into a processing chamber. The processing chamber has three areas for insertion: area 134, area 136, and area 138. FIG. 1C illustrates a robot head 130 inserting PCMD 100 into various areas of a processing chamber. Robot hands 130a (above, holding the electronics disc 106) and robot hand 130b (below, holding the substrate 104) are both capable of independently extending. FIGS. 1D and 1E illustrate three hands 130a, 130b, and 130c of robot head 130. In FIG. 1D, level robot hand 130b is extended away from robot hand 130a of robot hand 130. Level 130b or 130c would contain substrate 104, and level 130a or 130b, respectively, would contain electronics disc 106 when PCMD 100 is in its extended state. The robot head 130 would first have PCMD in its concentric state as seen in FIG. 1B as it approaches the chamber. Robot hand 130b would then extend away from hand 130a and thus separate substrate 104 from electronics disc 106. In this way, substrate 104 can be placed into area 134 as seen in FIG. 1C. If PCMD were to be placed into area 136, robot hands 130a and 130b would be inserted into area 136 with PCMD 100 in its concentric state. The substrate 104 would be lowered onto a sliding platform which would move substrate 104 to the process chamber at position 136. Prior to loading into robot hands 130a and 130b, PCMD 100 would be rotated to a proper orientation so that it could be extended along the axis of cable 108. Placement of substrate 104 into process chamber 138 would be substantially the same as for chamber 136 except for a different rotation angle to allow the extension along the axis of cable 108 to be in line with chamber 138.

Figure 1F:
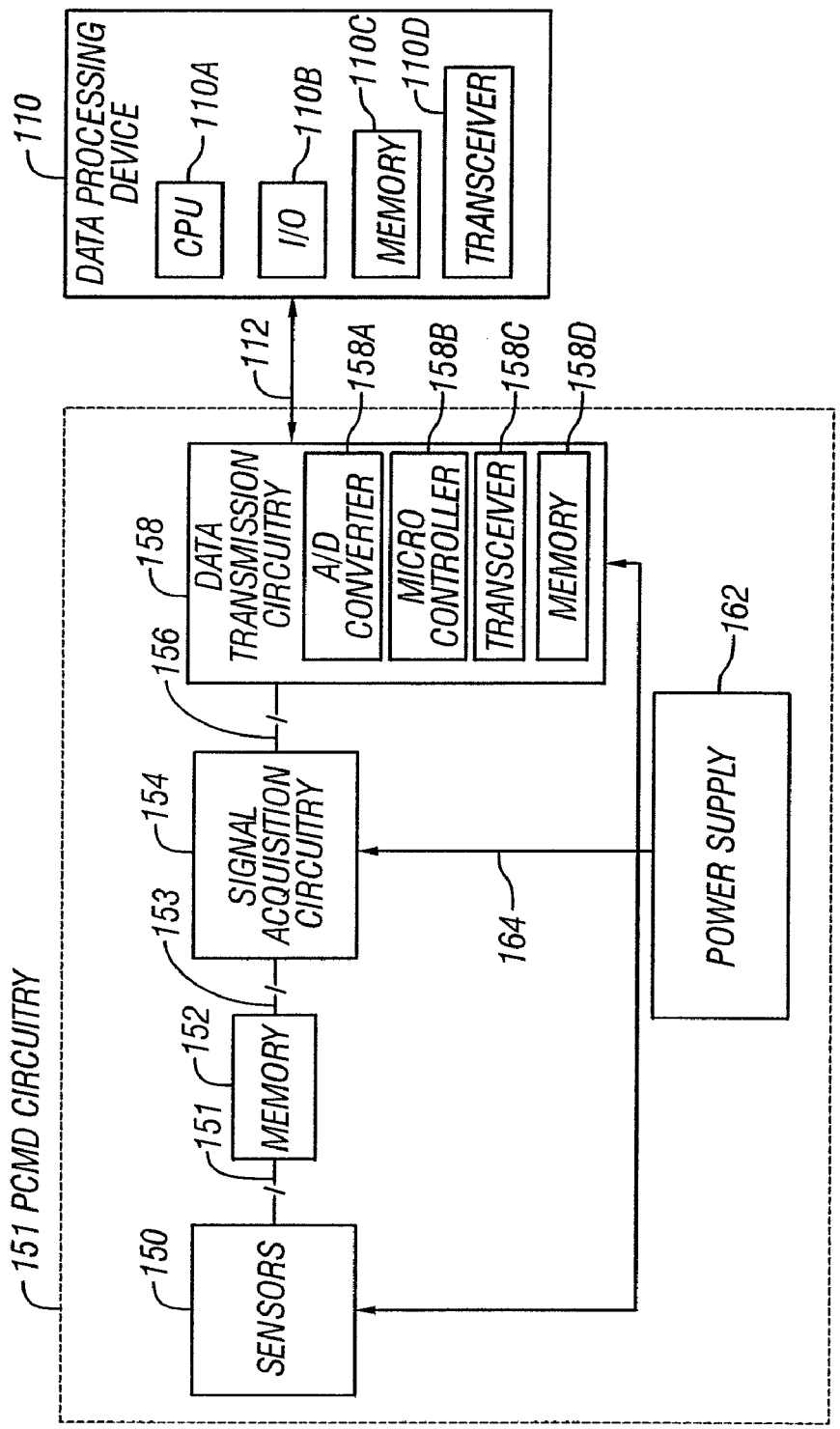
FIG. 1F is a schematic of the electronics and circuitry common to all embodiments.

FIG. 1F is a block diagram illustrating the electrical circuits and signal flow of PCMD circuitry 151 and DPD 110, which is common to all the embodiments of the invention. Sensors 150, as mentioned previously, are in or on substrate 104. The output of sensors 150 is coupled to SAC 154 via conductors 153. Memory 152 is optional and is preferably located near sensors 150 either on substrate 104 or on a connector of cable 108. Memory 152, if present, stores digital sensor data which is passed through SAC 154 without processing and continues through conductors 156 to DTC 158 for reading of the digital sensor data by the micro-controller 158B. Memory 152 may contain calibration coefficients for the sensors 150. In this way, even if the electronics disc 106 is changed, memory 152 and the calibration coefficients will remain with the appropriate sensors 150. SAC 154 is preferably located at electronics disc 106 but may be located at substrate 104 or anywhere within or external of the process chamber. SAC 154 contains the circuitry necessary to pick up the sensor outputs and if necessary provide any input power or other signals needed to drive the sensors such as amplifiers, current sources, and filters. SAC 154 drives the signal to data transmission circuitry ("DTC") 158 over conductors 156. Power supply 162 can be a storage cell, radiative energy conversion cell, or inductive coupled power source and powers all the components of PCMD 100 via electrical bus 164.

DTC 158 comprises the circuitry necessary to process, store and transmit the signals in analog or digital form from SAC 154 to DPD 110 over data link 112. In the case that the signals are sent digitally, DTC 158 may include one or more analog to digital converters 158A. A transceiver 158C within DTC 158 sends and receives the measured processing conditions and any control signals to and from transceiver 110d of DPD 110. Although transceiver 110d is shown as part of DPD 110, it may also be remotely located on robot head 130. DTC 158 may also contain calibration coefficients for the sensors 150. DTC 158 may read the calibration coefficient information and communicate it to data processing device 110 for applying the calibration correction to the measured data. DTC 158 may also optionally contain memory 158D to store the recorded processing conditions as measured by sensors 150 in the raw or corrected state, as well as other information such as the calibration coefficients. Microcontroller or gate array 158B manages the processes of DTC 158. Data link 112 may be a wireless link or may be a multi conductor data cable such as an RS 232 or universal serial bus (USB) connection. In the case that data link 112 is wireless, the transceivers 158c and 110d can communicate with infrared, acoustic, sonic, ultrasonic, or radio frequency signals. Any number of well-known protocols may be employed such as Bluetooth. The transceiver may also send and receive signals inductively. In PCMD 100, DTC 158 is a part of electronics disc 106, whereas in the following embodiments it may be located elsewhere. For clarity, interconnects or wiring within SAC 154, DTC 158 and DPD 110 have not been shown.

Data processing device 110 can be any microprocessor or gate array controlled device such as a computer or a personal digital assistant ("PDA") or a purpose built computer. DPD 110 includes a central processing unit 110A and may also include input/ output devices 110B such as a display or keyboard, mouse etc..., memory 110C, and transceiver 110D.

Substrate 104 has a base layer 140 that is preferably a silicon wafer, but can also be made out of numerous other materials that may be used in manufacturing integrated circuits or thin film devices including glass, ceramic, GaAs, carbide or nitride. Substrate 104 and electronics disc 106 are preferably 200 mm or 300 mm in diameter to simulate the size of current wafers and in order to be handled by conventional wafer handling machinery; however, they may be of any diameter or any shape.

Figure 1G:
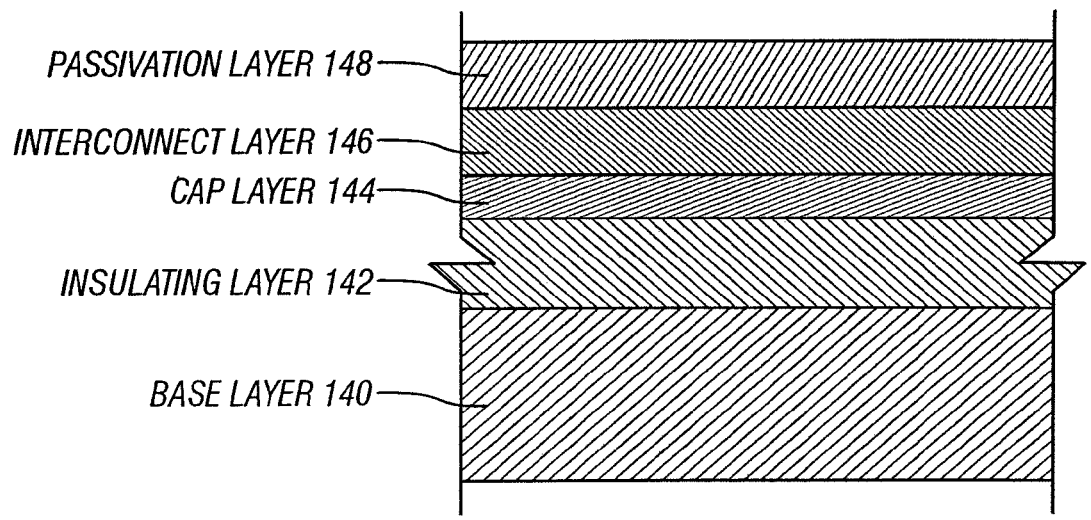
FIG. 1G is a cross section of substrate 104.
Figure 1H:
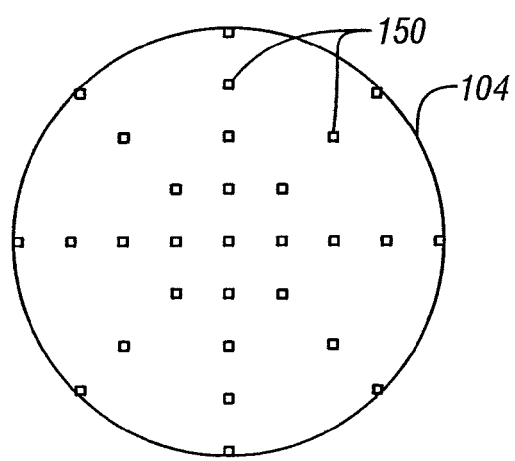
FIG. 1H is a top view of substrate 104.
Figure 1J:
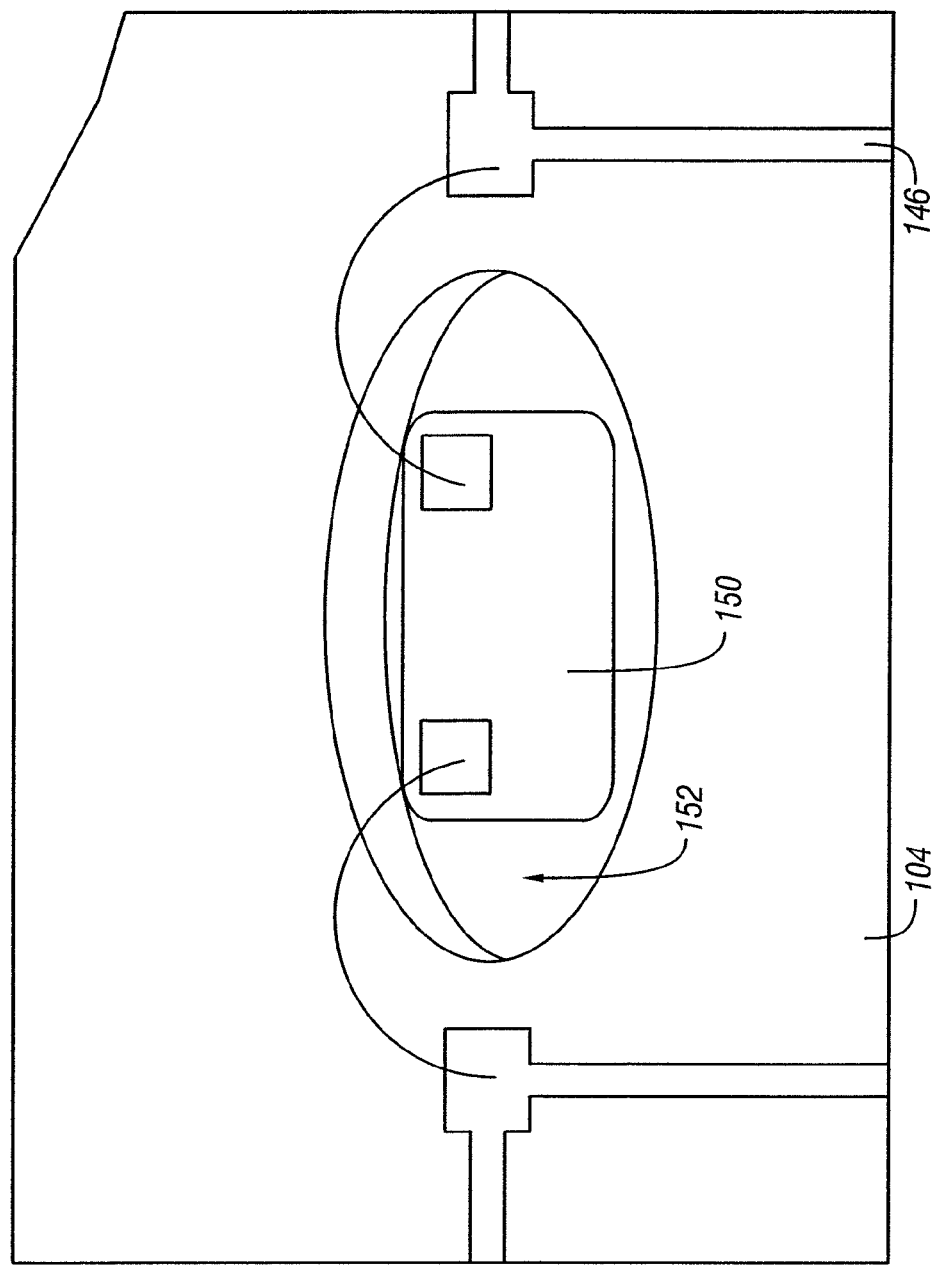
FIG. 1J is a perspective view of a sensor in substrate 104.

FIG. 1G is a cross section of substrate 104. In this illustrative example, base layer 140 is a silicon wafer with various layers formed upon the wafer. Base layer 140 has an insulating layer 142 upon base layer 140. Insulating layer 142 can be any insulative material but is preferably a thermal oxide such as silicon dioxide. A cap layer 144 is then formed on the top of insulating layer 142. Cap layer 144 compensates for any defects in insulating layer 142. Upon cap layer 144 is interconnect layer 146. Interconnect layer 146 is a conductive layer that is used to transfer the signals to and from the sensors monitoring the process conditions. Interconnect layer 146 is etched to form circuit traces leading to and from the precise location of the sensors, and any bond pads needed for interconnection. Additionally, the sensors themselves may be formed within interconnect layer 146, and within other conductive layers (not shown). Upon interconnect layer 146 is passivation layer 148. Passivation layer 148 is preferably a nitride layer but can be any type of dielectric material. FIG. 1H illustrates the preferred layout of sensors 150 on/in substrate 104, although many different layouts are possible and within the scope of the invention. FIG. 1J illustrates a discrete sensor 150 mounted in substrate 104 and connected to circuit traces formed in interconnect layer 146. A thermally conductive insulating ceramic material (not shown) covers sensor 150 and fills cavity 152. For more information on the sensors and interconnects made in a thin film layer directly deposited on the substrate, please refer to U.S. Pat. No. 6,190,040 B1 to Renken et al., entitled "Apparatus for Sensing Temperature on a Substrate in an Integrated Circuit Fabrication Tool," which is hereby incorporated by this reference in its entirety.

Sensors 150 are necessary for detecting various processing conditions are mounted on or fabricated in substrate 104 according to well known semiconductor transducer design. For measuring temperature, a popular transducer is an RTD or thermistor, which includes a thin-film resistor material having a temperature coefficient. A magneto-resistive material may also be used to measure the amount of magnetic flux exerted upon substrate 104. A resistance-to-voltage converter is often formed within the substrate between distal ends of the resistive-sensitive material (either thermistor or magneto-resistive material). Another exemplary temperature sensor includes a thermocouple made of two dissimilar conductors lithographically formed in the layers of the substrate. When the junction between the conductors is heated, a small thermoelectric voltage is produced which increases approximately linearly with junction temperature. Another example of a temperature sensor includes a diode that produces a voltage that increases with temperature. By connecting the diode between a positive supply and a load resistor, current-to-voltage conversion can be obtained from the load resistor. Another sensor is a piezoelectric device such as a quartz tuning fork fabricated from quartz crystal cut on a crystal orientation which exhibits a temperature dependent frequency of oscillation. The sensor's oscillating frequency can be referenced against a master oscillator formed by a piezoelectric device such as a quartz tuning fork which is fabricated from a crystal orientated to minimize frequency change with temperature. The frequency difference between the sensor and master oscillator would provide a direct digital temperature dependent signal. Piezoelectric sensors may also be used to sense mass change to measure deposition mass and rates or other process conditions.

Sensors 150 may also be used to measure pressure, force or strain at select regions across substrate 104, either as a discrete sensor or a sensor integrally formed in the layers of substrate 104. There are many types of pressure transducers capable of measuring the atmospheric pressure exerted upon the wafer. A suitable pressure transducer includes a diaphragm-type transducer, wherein a diaphragm or elastic element senses pressure and produces a corresponding strain or deflection which can then be read by a bridge circuit connected to the diaphragm or cavity behind the diaphragm. Another suitable pressure transducer may include a piezoresistive material placed within the semiconductor substrate of substrate 104. The piezoresistive material is formed by diffusing doping compounds into the substrate. The resulting piezoresistive material produces output current proportional to the amount of pressure or strain exerted thereupon.

Sensors 150 may also be used to measure flow rate across substrate 104. In addition, humidity and moisture sensors can also be formed upon substrate 104. A well-known method for measuring flow rate, a hot-wire anemometer, may be incorporated into substrate 104. Fluid velocity is based upon the frequency of vortex production as a streamlined fluidic flow strikes a non-streamlined obstacle formed upon substrate 104. Measurement of fluid flow generally involves the formation of special vortices on either side of the obstacle. Thus, an alternating pressure difference occurs between the two sides. Above a threshold (below which no vortex production occurs), the frequency is proportional to fluid velocity. Of many methods of detecting the alternating pressure difference, a hot thermistor is preferably placed in a small channel between the two sides of the obstacle. The alternating directions of flow through the capitalized channel periodically cool the self-heated thermistor thereby producing an AC signal and corresponding electric pulses at twice the vortex frequency. Therefore, an obstacle protruding from substrate 104 in front of a thermistor can provide solid-state flow rate measurement. Heat can be transferred between self heated thermistors placed in close proximity to each other. Fluid flow transfers thermal energy between the adjacent thermistors causing a thermal imbalance proportional to mass flow. Two or more adjacent sensors can be arrayed to measure flow along a vector, or multiple flow vectors may also be sensed. The thermal imbalance can be detected to produce a DC signal related to mass flow. Flows in multiple directions can be compared to detect flow vectors.

Sensors 150 can also be used to measure the gaseous chemical concentration placed upon substrate 104. Chemical composition sensors utilize a membrane which is permeable to specific ions to be measured. Ideally, the membrane should be completely impermeable to all other ions. The conductivity of the membrane is directly proportional to the transport of select ions which have permeated the membrane. Given the variability of membrane conductivity, measurements can be taken which directly correlate to the amount of chemical ions present within the ambient surrounding substrate 104.

Sensors 150 may also be used to measure ion current density and ion current energy with a parallel plate structure, an array of collecting plates, and collecting plates with control grids supported above the collecting plates. The current flowing between parallel plates, or to the array of collecting plates will increase with ion current density. Ion current energy can be detected by applying a constant or varying DC potential on the grids above the plates. This will modulate current flow with ion current energy allowing the energy distribution to be detected. This is useful in monitoring and regulating a deposition or etching process.

A piezoelectric transducer/sensor may also be integrated into substrate 104 to measure the resonant frequency of a layer and thus the mass or thickness of the layer.

Additionally, sensors 150 can also be used to detect a change in position or displacement of an object spaced from substrate 104. Exemplary displacement transducers include electro-optical devices which can measure photon energy (or intensity) and convert photon energy to an electric field or voltage. Relatively well known electro-optical devices include light-emitting diodes, photodiodes, phototransistors, etc., which can be formed upon a semiconductor substrate. Displacement sensors are used to provide accurate information about electrode spacing within an etch or deposition chamber, and can also provide spacing information between a wafer and corresponding masks and/or radiation source.

Figure 2:
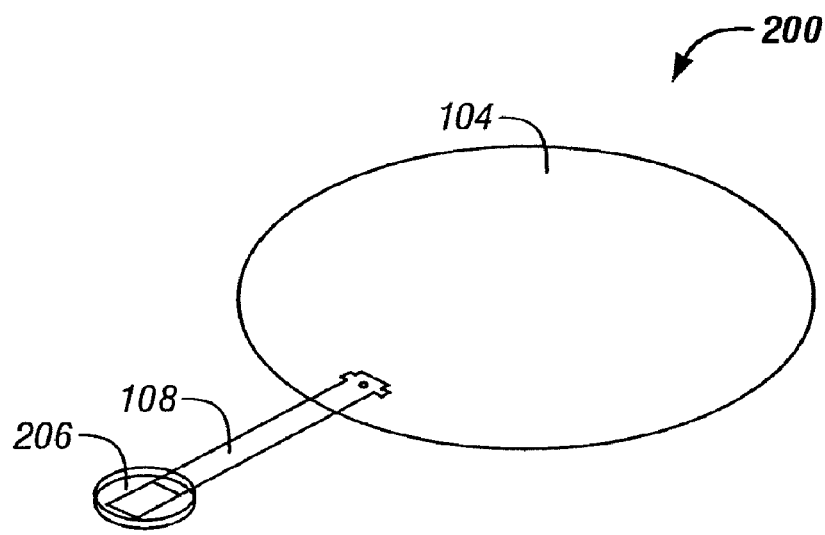
FIG. 2 is a perspective view of PCMD 200, another embodiment of the invention.

FIG. 2 illustrates another embodiment of a process condition measuring device, PCMD 200. PCMD 200 is similar to PCMD 100 except that electronics disc 206 is smaller than electronics disc 106 of PCMD 100 and substrate 104. As in PCMD 100, the electronics disc 206 is separated from substrate 104 in an extended position. PCMD 200 may come together with (above or below) substrate 104 or may always remain extended. Thus the electronics can be distanced from the deleterious conditions of the processing chamber. The electronics may be in a form factor other than a disc.

Figure 3A:
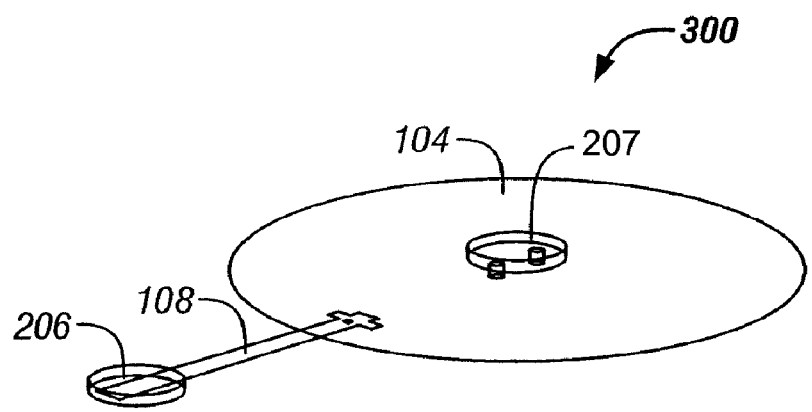
FIG. 3A is a perspective view of PCMD 300, another embodiment of the invention.

FIG. 3A illustrates yet another embodiment of a process condition measuring device, PCMD 300. PCMD 300 is similar to PCMD 200 of FIG. 2 but includes an additional electronics platform 207 upon the surface, into the surface or into a cavity of substrate 104. The electronic and power supply circuitry 151 previously contained in electronics disc 106 and 206 of PCMD 100 and 200 is now divided between electronics disc 206 and electronics platform 207. Any portion of PCMD circuitry 151 shown in FIG. 1F can be at either location and may also be duplicated on each platform. Preferably, signal acquisition circuitry 154 is part of electronics platform 207 and data transmission circuitry 158 is present at both electronics platform 207 and at electronics disc 206. Thus, communication to DPD 110 could be either from electronics platform 207 or electronics disc 206. Electronics platform 207 may be anywhere upon the surface of substrate 104. In this embodiment it is located in the center.

Figure 3B:
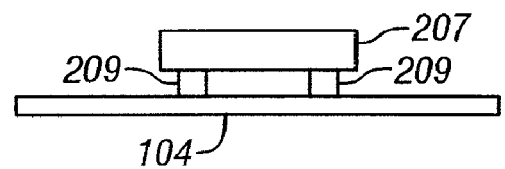
FIG. 3B is a plan view of PCMD 300.

As can be seen in FIG. 3B, electronics platform 207 is elevated from the surface of substrate 104 with one or more spacers or platform legs 209. As mentioned previously, a processing chamber may have rather large gradients in temperature and other parameters. In some cases, the most severe processing condition may be at the level of the wafer. Elevating the electronics from the surface of the wafer is another way of isolating the electronics from the harshest processing conditions. The platform 207 and the platform leg(s) 209 are preferably made from a material with similar/compatible characteristics as substrate 104, but could be made of virtually any material. Compatibility may relate to thermal coefficient of expansion, or other mechanical, electrical, or material properties. The distance that platform 207 is elevated from substrate 104 can be tailored depending on the processing condition anticipated to be measured, but is generally from 1 mm to 5 mm. Platform legs may range in size from 0.05 mm in diameter or width (if not round) to more than 1.0 mm and are preferably of a minimal diameter or width of about 0.05 mm diameter to limit heat transfer between the substrate and platform. Signals from the electronic circuitry of platform 207 are transferred to substrate 104 via either a small electrical cable or conductors integral to platform legs 209.

Figure 4:
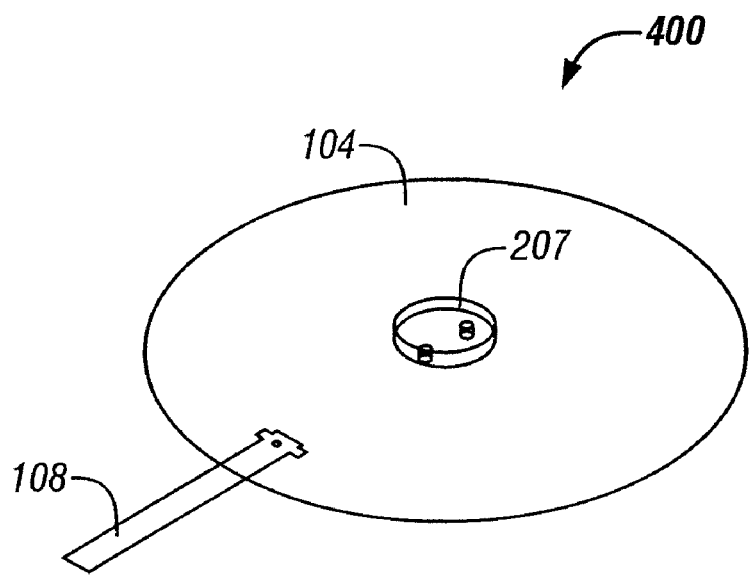
FIG. 4 is a perspective view of PCMD 400, another embodiment of the invention.

FIG. 4 illustrates PCMD 400, another embodiment of the invention. PCMD 400 is similar to PCMD 300 except that it does not include electronics disc 206. Electronics platform 207 includes SAC 154 and DTC 158. Power supply 162 is preferably located on platform 207 but may also be located on substrate 104. Cable 108 may extend outside the process chamber to function as an antenna, or external transducer, to support the transceiver by allowing communications which would be prevented from within the closed process chamber containing substrate 104 and electronics platform 207. Cable 108 would thus act as part of data link 112, in transmitting signals, real time or delayed, between DTC 158 and DPD 110. Alternatively, cable 108 can be connected directly to DPD 110, and thus data link 112 would be a wired link.

Figure 5:
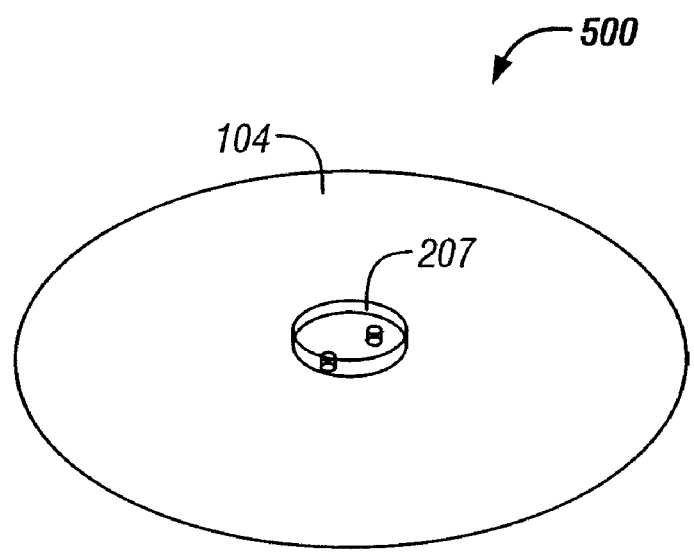
FIG. 5 is a perspective view of PCMD 500, another embodiment of the invention.

FIG. 5 illustrates PCMD 500, yet another embodiment of the invention. PCMD 500 lacks the cable 108 of PCMD 400 but is otherwise similar. Accordingly, PCMD 500 communicates wirelessly over data link 112. An antenna is preferably integrated into electronics platform 207 but may also be formed in or upon substrate 104.

Thus far, in all of the embodiments featuring electronics platform 207, that is, PCMD 300, 400, and 500, the platform has been located in the center of substrate 104. This is because it is important to keep the process condition measuring device properly balanced as it may be spun or rotated by a robot arm. However, thermal balance is also important, as is the balance of many other processing conditions. As mentioned previously, a processing condition may vary greatly throughout the processing chamber. Each different processing condition has its own profile or gradient within the processing chamber. Thus, in order to accommodate these variations it is advantageous to vary the location of electronics platform 207 depending on the processing condition, or to locate more than one platform upon or into the substrate.

Figure 6:
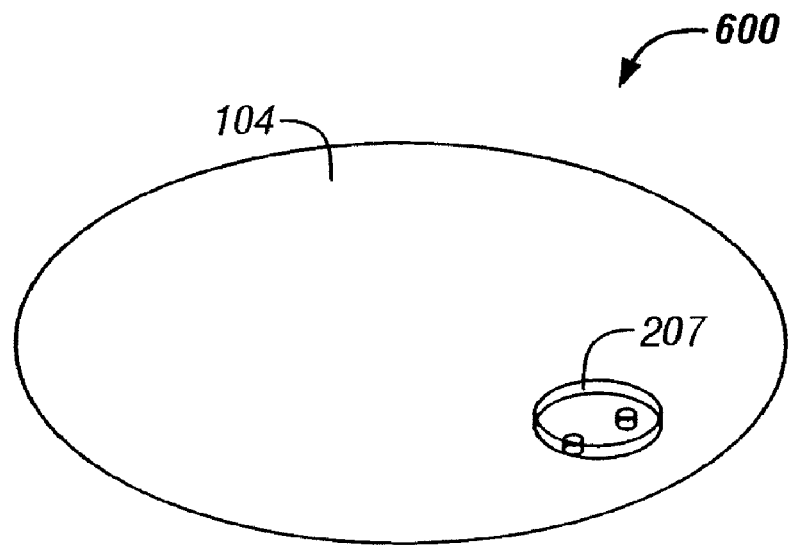
FIG. 6 is a perspective view of PCMD 600, another embodiment of the invention.
Figure 7:
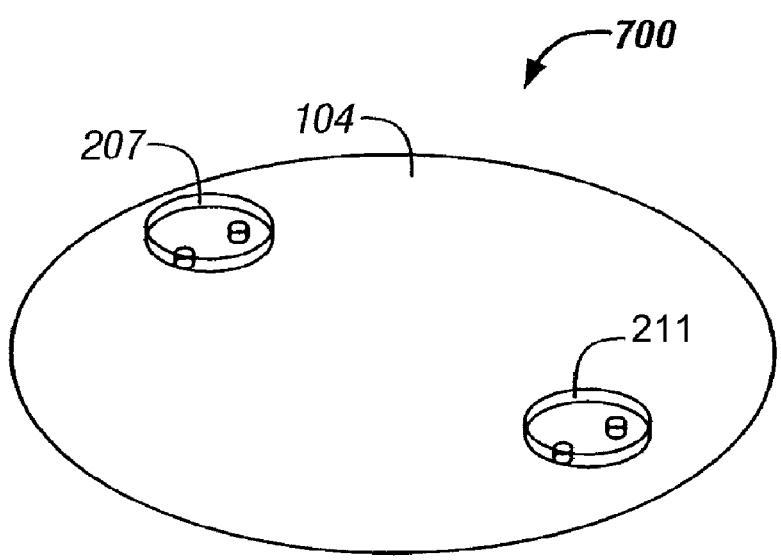
FIG. 7 is a perspective view of PCMD 700, another embodiment of the invention.

In FIG. 6, PCMD 600 has electronics platform 207 located near the edge of substrate 207. Otherwise PCMD 600 is the same as PCMD 500. In FIG. 7, PCMD 700 has two or more electronics platforms 207 and 211 located on a diameter of substrate 104 and equally distanced from the center of substrate 104. PCMD circuitry 151 may be divided in any proportion between electronics platform 207 and 211—including a configuration wherein platform 209 has no electronic components or circuitry. Also, the PCMD circuitry 151 may be duplicated on each platform.

In any embodiment a platform containing all or part of the PCMD circuitry 151, i.e., memory 152, SAC 154, DTC 158, and power supply 162 may be alternatively integrated into the substrate or contained within a cavity formed within the substrate. This is done so that the substrate 104 used to measure the processing conditions has substantially the same mass as a production substrate subject to the processing conditions of actual production. The objective is to remove the same mass of substrate as added by the platform in order to accurately simulate the effects on as similar a test substrate (104) as possible. Dynamic thermal response times to temperature changes can be most accurately measured if the mass and thermal conduction within substrate 104 is similar to the product substrate.

Figure 8:
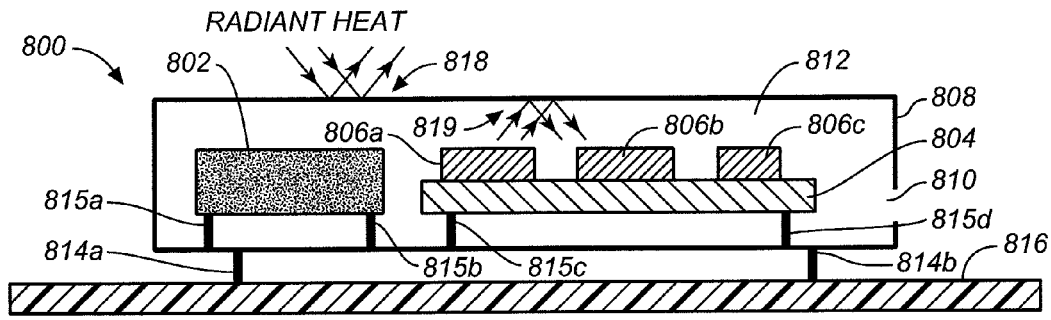
FIG. 8 shows a cross section of electronics platform 800 having an interior volume with an opening to the exterior.

FIG. 8 shows an electronics platform 800 according to an embodiment of the present invention. Electronics platform 800 is similar to electronics platform 207 of FIG. 3B but has additional features that make it particularly suitable for use at high temperatures. Electronics platform 800 includes a power source 802 and a printed circuit board (PCB) 804 with integrated circuits 806a-c mounted on it. PCB 804 and integrated circuits 806a-c may collect data from sensors and store it in a memory or transmit it (wirelessly or otherwise) to a remote unit for processing. Electronics platform 800 has an enclosure 808 that encloses internal components of electronics platform 800. Enclosure 808 does not hermetically seal an interior volume 812, but instead has an opening 810 so that interior volume 812 is in fluid communication with the exterior of enclosure 808. Thus, gas can flow from interior volume 812 to the exterior, and gas from the exterior can enter interior volume 812. When electronics platform 800 is placed in a chamber that is then put under vacuum (evacuated to a sub-atmospheric pressure, for example 3 milliTorr) interior volume 812 becomes evacuated. The size of opening 810 may be such that interior volume 812 does not have a significantly different pressure to the exterior. Thus, if electronics platform 800 is to be subject to rapid changes in pressure, then opening 810 may be made large. If only slow changes in pressure are to be experienced, then opening 810 may be made relatively small. The size of opening 810 may be chosen according to the size of interior volume 812, with a larger volume requiring a larger opening. A low profile electronics platform may have a very small interior volume that requires only a small opening. In one example, a small gap where leads enter an electronics platform is sufficient to keep pressure in a small interior volume at approximately the same pressure as the exterior. It is generally desired to keep opening 810 small to reduce the amount of heat entering through opening 810. Vacuum is a poor thermal conductor. Thus, when interior volume 812 is under vacuum, it reduces any flow of heat from enclosure 808 to power source 802, PCB 804 and integrated circuits 806a-c. Interior volume 812 acts as a thermally insulating volume to insulate these internal components against a high external temperature.

Enclosure 808 may be made of a suitable material so that power source 802, PCB 804 and integrated circuits 806a-c are maintained at lower temperatures than the exterior of enclosure 808. Enclosure 808 may be made of a material that tends to reflect radiant heat so that as heat energy is directed towards enclosure 808 it tends to be reflected away from enclosure 808 and not absorbed. Enclosure 808 may be made of a material having a high specific heat capacity so that as heat is absorbed, it causes the temperature of enclosure 808 to rise slowly and thus delays the heating of internal components. Examples of materials that may be reflective to radiant heat and have specific high heat capacities include Invar (a Nickel-Iron alloy) and stainless steel. However, the weight of an electronics module may also be important, especially when it is on a thin glass substrate. In order to keep the weight of a module down, enclosure 808 may be made of Aluminum. While Aluminum has lower heat capacity than Invar, it is much lighter and can be reflective to radiant heat.

Electronics platform 800 provides internal components, such as power source 802, PCB 804 and integrated circuits 806a-c with protection from heat that might be transferred by conduction, convection or radiation. Conductive transfer of heat from below is reduced by using legs 814a, 814b that elevate electronics platform 800 from substrate 816. Legs 814a, 814b may have small cross-sectional areas (approximately 0.5 millimeters in diameter in some examples). Legs may be made small, while remaining large enough to provide necessary physical support for an electronics platform. Legs may be made of a material having a low coefficient of thermal conductivity such as ceramic. In some examples, legs are formed from the same material as the enclosure so that they can be formed together as integral components. Thus, both enclosure 808 and legs 814a, 814b may be formed of Aluminum. Legs 815a-d are also provided to raise power source 802 and PCB 804 from the bottom of enclosure 808. This reduces heat flow from enclosure 808 to internal components. In some cases, a layer of insulating material such as kapon tape may be used instead of legs 815a-d to form an insulating layer. Such an insulating layer may be continuous or formed of discontinuous portions. In addition, conductive transfer of heat from enclosure 808 to internal components is reduced, where electronics platform 800 is used in a vacuum, because internal volume 812 acts as a thermally insulating volume. Even where a high level of vacuum is not achieved, reduced pressure in internal volume 812 reduces heat transfer from enclosure 808 to internal components. Internal volume extends between power source 802, integrated circuits 806a-c and enclosure 808 so that these components do not contact each other. Thus, a gap is generally maintained between enclosure 808 and any internal components. In air, or some other ambient gas, the ambient gas enters internal volume 812 and provides insulation between enclosure 808 and internal components. Convective transfer of heat between external components (such as a process chamber wall) and electronics platform 800 is reduced as the pressure surrounding electronics platform 800 is reduced. As less gas is present to convey heat, less heat is transferred in this way. Similarly, convective transfer between enclosure 808 and internal components is reduced as the pressure in internal volume 812 is reduced. Radiant transfer of heat to electronics platform 800 is reduced by providing a reflective external surface 818 on enclosure 808. All exterior surfaces of enclosure 808 may be made reflective, or just certain chosen surfaces may be reflective if heat is received from a particular direction. Interior surfaces, such as surface 819, may also be made reflective. Such reflective surfaces generally have low emissivity and therefore radiate relatively little heat energy when at a given temperature. A reflective surface, such as reflective surface 818, may be provided by using a metal as the material for the exterior or interior surface of an enclosure. The surface may be polished to make it more reflective. In one example, polished steel is used to form the enclosure. An additional reflective layer may be added inside enclosure 808. In one example, one or more reflective metallic layers, for example aluminum foil layers, surround power source 802, PCB 804 and integrated circuits 806a-c. Electronics platform 800 connects to one or more sensors mounted to substrate 816 as previously described.

Figure 9:
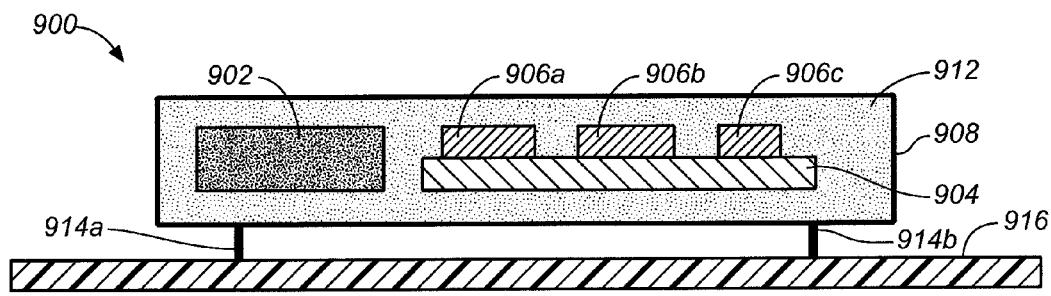
FIG. 9 shows a cross section of electronics platform 900 having a hermetically sealed interior volume that provides thermal insulation.

FIG. 9 shows an alternative electronics platform 900. Electronics platform 900 has a power source 902, PCB 904 and integrated circuits 906a-c contained within enclosure 908. Enclosure 908 is elevated from substrate 916 by legs 914a, 914b. Unlike electronics platform 800, electronics platform 900 does not have an opening in enclosure 908. Thus, enclosure 908 is hermetically sealed. Interior volume 912 of electronics platform 900 forms a thermally insulating volume that is not connected with the exterior. In one example, interior volume 912 is a vacuum. Thus, enclosure 908 is sealed under vacuum so that interior volume 912 remains evacuated. Legs may be provided to space power source 902 and PCB 904 from enclosure 908. In another example, interior volume 912 is filled with a gas that provides insulation between enclosure 908 and internal components. In another example, interior volume is filled with a solid that has a low coefficient of thermal conductivity so that it provides insulation. A foam that encapsulates gas bubbles within a solid may also be used to fill internal volume 912.

In another embodiment, internal volume 912 may be filled with a phase change material. Phase change materials are materials that absorb heat energy, as they undergo a phase change at their melting point. When a solid phase change material is heated up and reaches its melting point, it goes through a phase change, from solid to liquid. During this process the phase change material absorbs a certain amount of heat, known as melting enthalpy. Despite the heat input, the temperature of the material stays at a relatively constant temperature, even though phase change is taking place. This is sometimes described as latent heat being taken up by the material. Particular phase change materials may be chosen for their melting point and their high specific melt enthalpy (or specific latent heat of fusion). A phase change material should have a melting point that is within the operating range of any components to be protected because it tends to keep surrounding components at its melting point as it undergoes a phase change. However, the melting point of the phase change material should be higher than room temperature (approximately 18-20 degrees Centigrade) so that the phase change material is solid at room temperature. Typically, it is desirable to keep the electronic components (such as integrated circuits 906a-c below a maximum operating temperature of approximately 85 degrees Centigrade. Thus, a phase change material may be chosen that has a melting point between 20 and 85 degrees Centigrade and has a high specific melt enthalpy. Various phase change materials are available from Rubitherm™ GmbH, including RT35, which has a melting point of 35 degrees Centigrade and which has a heat storage capacity of 157 kiloJoules/kilogram between 27 and 42 degrees Centigrade. The amount of phase change material may also be chosen according to the temperature and duration of any heating process to be experienced by an electronics platform. In some examples, electronic components may have higher temperature ratings, so that they can operate at temperatures greater than 85 degrees Centigrade. Also, electronic components may be adapted for use at higher temperatures than their specified maximum temperature. U.S. Patent Application Publication No. 2004/0225462, entitled, "Integrated process condition sensing wafer and data analysis system," describes methods of adapting conventional integrated circuits so that they may be operated at temperatures above their specified temperature range. Such methods may be applied to integrated circuits in an electronics platform. Integrated circuits in an electronics module may be packaged or unpackaged. Unpackaged integrated circuits may have bond pads on a semiconductor surface connected directly to a PCB or other external circuitry without going through a lead frame. Without packaging, an integrated circuit may be smaller and so allow an electronics platform to have a lower profile. A power source such as a battery may also have a specified temperature range outside of which it ceases to operate, or ceases to operate satisfactorily. Typically, batteries operate up to 65-85 degrees Centigrade. Some batteries may operate at up to 150 degrees Centigrade.

Figure 10:
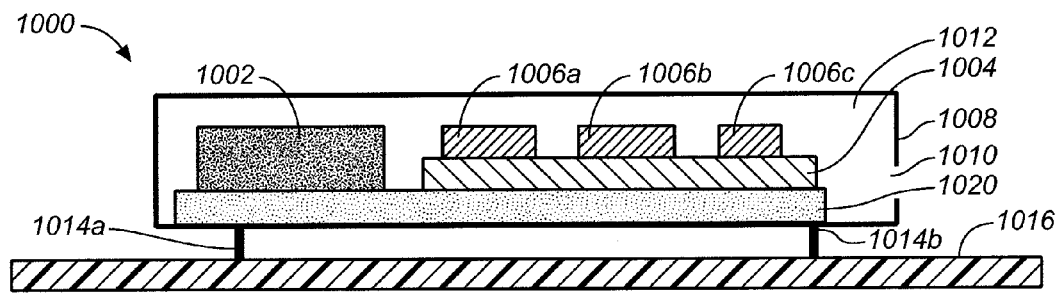
FIG. 10 shows a cross section of electronics platform 1000 that includes a phase change material to reduce the temperature of internal components.

FIG. 10 shows an alternative electronics platform 1000 having an opening 1010 that connects interior volume 1012 to the exterior of enclosure 1008 and having phase change material portion 1020 within enclosure 1008. This combines the advantages of insulation provided by vacuum in interior volume 1012 with the temperature stabilizing effects of a phase change material. The thermally insulating volume, internal volume 1012, partially surrounding internal components including power source 1002, PCB 1004 and integrated circuits 1006a-c helps to prevent heat energy from reaching internal components. When heat energy does reach the internal components, the heat energy is absorbed by phase change material portion 1020. This tends to keep internal components at approximately the melting point of the phase change material. Phase change material portion 1020 is shown extending across the bottom of enclosure 1008 under power source 1002 and PCB 1004. However, in other examples, the locations of these components within enclosure 1008 may be different. As before, legs 1014a-1014b are provided to elevate electronics platform 1000 from substrate 1016 and enclosure 1008 may have a reflective outer surface.

Figure 11:
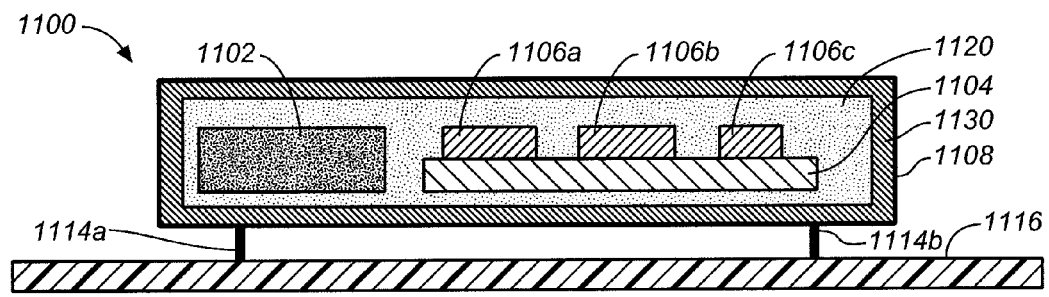
FIG. 11 shows a cross section of electronics platform 1100 that includes a phase change material and an insulating layer surrounding internal components.

FIG. 11 shows yet another alternative electronics platform 1100. Electronics platform 1100 has internal components including power source 1102, PCB 1104 and integrated circuits surrounded by a phase change material portion 1120. Surrounding phase change material 1120 is a thermally insulating layer 1130. Phase change material may be used to fill a predefined cavity by heating it above its melting point and pouring it into the cavity while it is in liquid form. Thus, enclosure 1108 may be provided with a thermally insulating layer 1130 of some suitable material. Then, power source 1102, PCB 1104 and integrated circuits 1106a-c may be placed in the enclosure and the remaining volume filled with a suitable phase change material to form phase change material portion 1120. Enclosure 1108 may then be sealed. In one example, thermally insulating layer 1130 is a suitable solid, or solid trapping gas bubbles. In one example, thermally insulating layer 1130 is a rigid, porous, insulating material with vacuum instead of gas bubbles to reduce conduction of heat through insulating layer 1130. In another example, thermally insulating layer 1130 may be formed of a gas or a vacuum. Phase change material portion 1120 may be contained in a container (not shown) so that it maintains its position as it melts. Thermally insulating layer 1130 extends between such a container and enclosure 1108. Where thermally insulating layer 1130 is a vacuum, it may be formed by sealing enclosure 1108 under vacuum or by having an opening in enclosure 1108 while operating under vacuum. As before, legs 1114a, 1114b are provided to elevate electronics platform 1100 from substrate 1116 and enclosure 1108 may have a reflective outer surface.

Figure 12A:
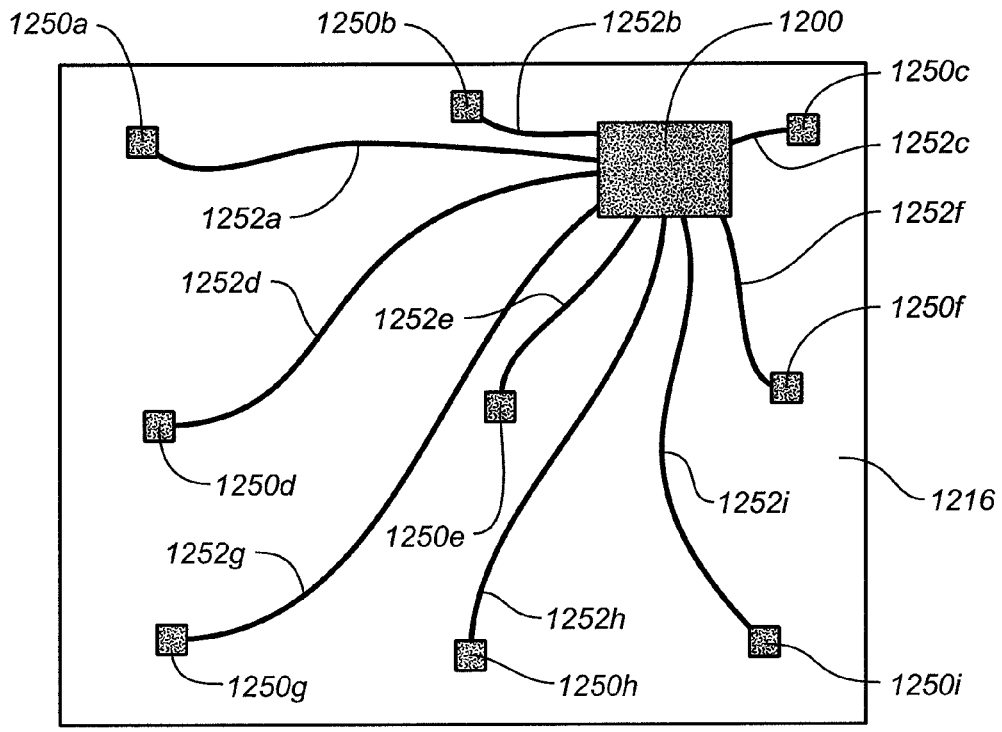
FIG. 12A is a top view of substrate 1216 showing electronics platform 1200 and sensors 1250a-i.

FIG. 12A show a glass substrate 1216 having an electronics platform 1200 from above. Electronics platform 1200 may be similar in structure to any of electronic platforms 800-1100 described above. Electronics platform 1200 is connected to a plurality of sensor units 1250a-1250i through leads 1252a-1252i. Sensor units 1250a-1250i are arranged across a surface of glass substrate 1216 so that they measure one or more process conditions at various locations. Each sensor unit may contain a single sensor to measure a single process condition or may have more than one sensor to measure more than one process condition. Not all sensor units are necessarily identical so that some may measure different process conditions than others. Data from sensor units 1250a-1250i are sent to electronics platform 1200 via leads 1252a-1252i. Data may be stored in electronics platform 1200 for later recovery or may be sent from electronics platform 1200 to another location using data transmission circuitry in electronics platform 1200. In one example, sensor units 1250a-1250i measure temperature across substrate 1216. Temperature data are then stored in a memory in electronics platform 1200 for later recovery and analysis.

Figure 12B:
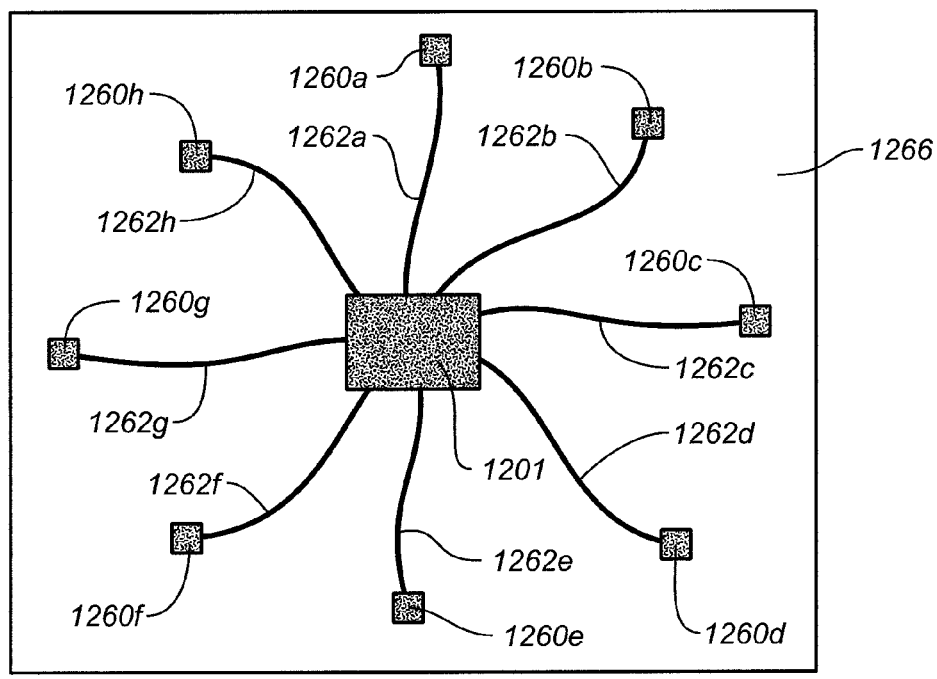
FIG. 12B is a top view of substrate 1266 showing a different arrangement of an electronics platform 1201 and sensors 1260a-h.

FIG. 12B shows an alternative arrangement of sensor units across a substrate. Electronics platform 1201 is located in the center of glass substrate 1266 with sensors 1260a-1260h distributed across substrate 1266 connected to electronics platform 1201 by leads 1262a-1262h.

Figure 13:
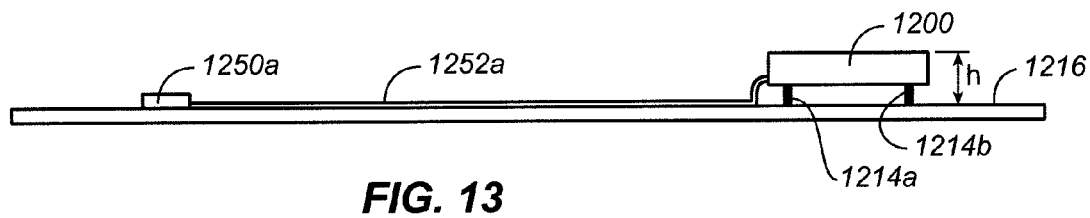
FIG. 13 shows a cross section of electronics platform 1200 mounted on a substrate.

FIG. 13 shows electronics module 1200 and a portion of substrate 1216 in cross section. Sensor unit 1250a is shown connected to electronics platform 1200 by lead 1252a. Examples of sensor units and methods of locating and attaching them to glass substrates are given in U.S. Pat. No. 6,915,589, which patent is hereby incorporated by reference in its entirety. Glass substrates, such as Flat Panel Display (FPD) substrates, may be large (dimensions of 2 meters or more) and very thin (0.5 to 1.1 millimeters being typical). Such glass substrates are generally moved by automated equipment that requires that substrates conform to certain physical dimensions. For example, openings in some processing equipment may be approximately 13 millimeters in height, while in other equipment even smaller openings may be used. In order to allow an instrumented substrate, such as substrate 1216, to pass through such an opening the height of an electronics platform, such as electronics platform 1200, must be kept relatively small. The total height h of electronics platform 1200 from the upper surface of substrate 1216 is approximately 8 millimeters in the present example. Legs 1214a, 1214b of electronics platform 1200 are approximately 0.5 millimeters in height and the enclosure measures approximately 7.5 millimeters in height.

Figure 14:
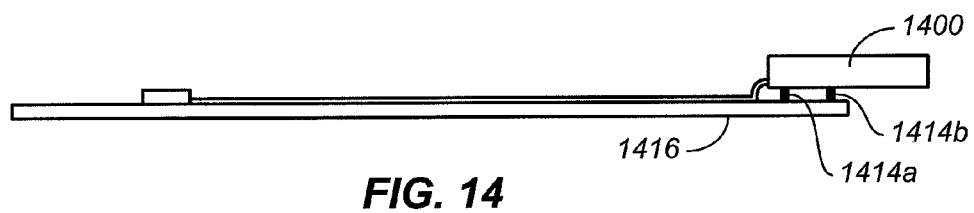
FIG. 14 shows an alternative location for an electronics platform 1400 mounted on a substrate so that it partially extends beyond an edge of the substrate.

FIG. 14 shows an alternative arrangement where electronics platform 1400 is supported by legs 1414a-b such that it only partially overlies substrate 1416. Thus, part of electronics platform 1400 extends beyond substrate 1416. This may be advantageous, because it may keep electronics platform 1400 in a location that does not receive as much heat during processing of substrate 1416. Also, 1400 has a smaller footprint on substrate 1416. That is, electronics platform 1400 extends over a smaller portion of substrate 1414 than it would if it were entirely overlying substrate 1416. Thus, any effects on measurements of process parameters that might be caused by an electronics platform are reduced. While simple, vertical legs 1414a-b are shown supporting electronics platform 1400, any suitable structure may be used.

Figure 15A:
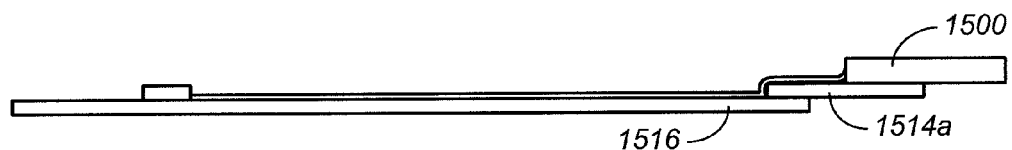
FIG. 15A shows another alternative location for an electronics platform 1500 mounted on a substrate so that it does not overlie the substrate.
Figure 15B:
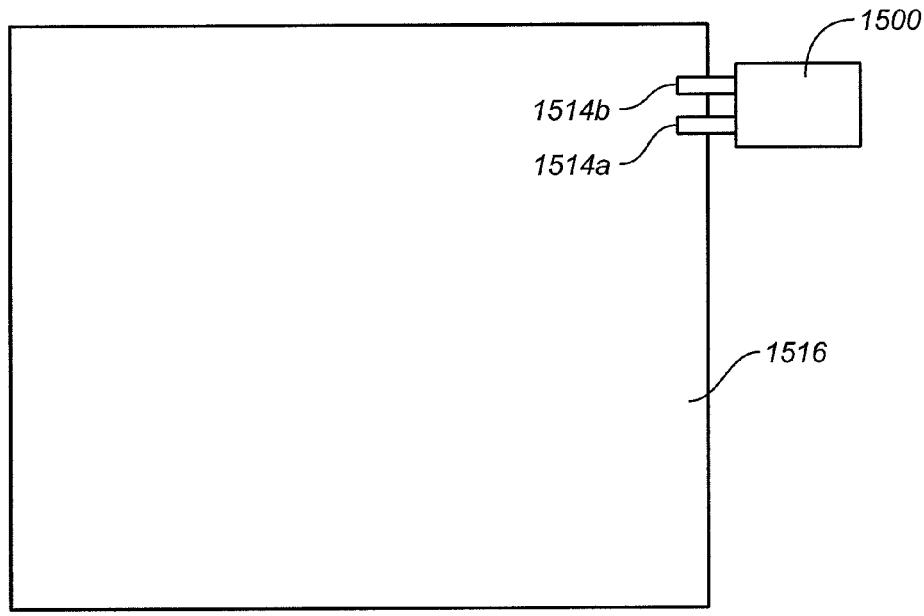
FIG. 15B is a top view of electronics platform 1500, showing its location outside the perimeter of substrate 1516.

FIGS. 15A and 15B show yet another alternative structure where electronics module 1500 is supported by legs 1514a-b in a location that is outside the perimeter of substrate 1516 so that electronics platform 1500 does not overlie any portion of substrate 1516. This structure may have the advantage that electronics platform 1500 may receive less heat in this location than if it were located overlying, or partially overlying substrate 1516. Also, electronics platform 1500 does not have a footprint on substrate 1516 so that electronics platform 1500 should have little or no effect on any measurements collected from substrate 1516. For example, any shadowing that might affect temperature measurements is reduced or eliminated. While two legs 1514a-b are shown, any suitable structure may be used to locate electronics module 1500 with respect to substrate 1516.

While the above examples show particular arrangements of components to provide protection from high temperatures for components of an electronics platform, other arrangements are also possible. Thermally insulating volumes (either vacuum, gas, solid, foam or other suitable structure) may be located anywhere that conduction of heat is to be reduced. Reflective surfaces may be provided anywhere that radiant heat is likely to be directed. A material having a high heat capacity may be used. Materials are also chosen to keep the mass of the electronics platform low. One or more portions of phase change material may be provided at one or more locations to keep temperatures down at those locations. Different phase change materials may be used for different applications. Using techniques of the present invention, electronics platforms with conventional components may be used in temperature ranges of up to 470 degrees Centigrade and even above 470 degrees Centigrade. An electronics platform may withstand elevated temperatures for periods of up to 10 minutes, or in some cases more than 10 minutes. There is generally a trade-off between temperature and duration, meaning that an electronics platform may withstand higher temperatures for shorter durations. In some cases, electronics platforms may withstand over 470 degrees Centigrade for over 10 minutes while continuing to function. Such instrumented glass substrates may be used to measure process conditions across a glass substrate during Chemical Vapor Deposition (CVD) of a thin film on a glass substrate.

While particular embodiments of the present invention and their advantages have been shown and described, it should be understood that various changes, substitutions, and alterations can be made therein without departing from the spirit and scope of the invention as defined by the appended claims. For example, the location and type of the sensors may be different than in the examples described. Additionally, the electronics platform or disc may be recessed into a cavity of the measuring substrate, and circuitry that performs the same function in the same way to get the same result is also within the scope of the invention.

The invention claimed is:

1. A system for sensing processing conditions comprising: a substrate; a plurality of sensors attached to the substrate; an electronics platform electrically coupled to the plurality of sensors; the electronics platform having an enclosure that encloses at least one integrated circuit, the enclosure including a thermally insulating volume; and the electronics platform mounted to the substrate by one or more legs that elevate the platform from the substrate, wherein the enclosure is above the one or more legs, so that a bottom surface of the enclosure is above a top surface of the substrate.

2. The system of claim 1 wherein the thermally insulating volume is in fluid communication with an external volume that is external to the enclosure.

3. The system of claim 2 wherein the thermally insulating volume is evacuated as the external volume is evacuated.

4. The system of claim 1 wherein the thermally insulating volume is filled with a material having a low coefficient of thermal conductivity.

5. The system of claim 4 wherein the enclosure is hermetically sealed.

6. The system of claim 1 wherein the enclosure has an outer surface that is reflective to radiant heat.

7. The system of claim 1 further comprising a phase change material within the enclosure.

8. The system of claim 1 wherein the substrate is comprised of glass.

9. The system of claim 1 wherein the one or more legs have a height of less than one millimeter.

10. The system of claim 1, wherein the enclosure is made of the same material as the one or more legs.

11. The system of claim 1, wherein the one or more legs are made of a material having low thermal conductivity.

* * * * *